(12) United States Patent
Wang et al.

(10) Patent No.: US 12,185,461 B2
(45) Date of Patent: Dec. 31, 2024

(54) ELECTRONIC DEVICE

(71) Applicant: InnoLux Corporation, Miao-Li County (TW)

(72) Inventors: Cheng-Chi Wang, Miao-Li County (TW); Chin-Ming Huang, Miao-Li County (TW); Chien-Feng Li, Miao-Li County (TW); Chia-Lin Yang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 203 days.

(21) Appl. No.: 18/073,592

(22) Filed: Dec. 2, 2022

(65) Prior Publication Data
US 2024/0114619 A1 Apr. 4, 2024

(30) Foreign Application Priority Data
Sep. 30, 2022 (CN) .......................... 202211211842.2

(51) Int. Cl.
| | |
|---|---|
| H05K 1/00 | (2006.01) |
| H05K 1/11 | (2006.01) |
| H05K 3/40 | (2006.01) |
| H05K 3/46 | (2006.01) |

(52) U.S. Cl.
CPC ........... *H05K 1/113* (2013.01); *H05K 3/4038* (2013.01); *H05K 3/4673* (2013.01); *H05K 2201/0266* (2013.01)

(58) Field of Classification Search
CPC .... H05K 1/113; H05K 3/4038; H05K 3/4673; H05K 2201/0266
See application file for complete search history.

(56) References Cited

U.S. PATENT DOCUMENTS

| | | | |
|---|---|---|---|
| 10,304,817 B2 | 5/2019 | Lin | |
| 2012/0189818 A1* | 7/2012 | Hayashi | H05K 3/4655 428/323 |
| 2013/0043067 A1* | 2/2013 | Hayashi | H05K 1/036 977/932 |
| 2013/0149514 A1* | 6/2013 | Hayashi | H01L 23/145 428/323 |

FOREIGN PATENT DOCUMENTS

TW I636530 B 9/2018

\* cited by examiner

*Primary Examiner* — Pete T Lee
(74) *Attorney, Agent, or Firm* — Winston Hsu

(57) ABSTRACT

An electronic device including an electronic unit and a redistribution layer is disclosed. The electronic unit has connection pads. The redistribution layer is electrically connected to the electronic unit and includes a first insulating layer, a first metal layer and a second insulating layer. The first insulating layer is disposed on the electronic unit and has first openings disposed corresponding to the connection pads. The first metal layer is disposed on the first insulating layer and electrically connected to the electronic unit through the connection pads. The second insulating layer is disposed on the first metal layer. The first insulating layer includes first filler particles, and the second insulating layer includes second filler particles. The first filler particles have a first maximum particle size, the second filler particles have a second maximum particle size, and the second maximum particle size is greater than the first maximum particle size.

20 Claims, 8 Drawing Sheets

ELECTRONIC DEVICE

BACKGROUND OF THE DISCLOSURE

1. Field of the Disclosure

The present disclosure relates to an electronic device, and more particularly to an electronic device including an insulating layer with filler particles.

2. Description of the Prior Art

In recent years, due to the miniaturization and high density of electronic elements in electronic devices, various packaging technologies of electronic elements have been developed. In prior art, an insulating layer or dielectric layer disposed on the electronic element may have a thick thickness to protect the electronic element. However, the thick insulating layer or dielectric layer may cause the space in the device to be cramped, and therefore the space for subsequently disposing the circuit wires on the insulating layer is constrained.

SUMMARY OF THE DISCLOSURE

One of objectives of the present disclosure is to provide an electronic device, so as to solve the problems encountered by the conventional electronic devices, and improve the fan-out circuit design of the electronic device, thereby improving the design flexibility of the input/output wire of the electronic device and improving the reliability of the electronic device.

An embodiment of the present disclosure provides an electronic device. The electronic device includes an electronic unit and a redistribution layer. The electronic unit has a plurality of connection pads. The redistribution layer is electrically connected to the electronic unit, and the redistribution layer includes a first insulating layer, a first metal layer and a second insulating layer. The first insulating layer is disposed on the electronic unit and has a plurality of first openings. The plurality of first openings are disposed corresponding to the plurality of connection pads. The first metal layer is disposed on the first insulating layer and electrically connected to the electronic unit through the plurality of connection pads. The second insulating layer is disposed on the first metal layer. The first insulating layer includes a plurality of first filler particles, and the second insulating layer includes a plurality of second filler particles. The plurality of first filler particles have a first maximum particle size, the plurality of second filler particles have a second maximum particle size, and the second maximum particle size is greater than the first maximum particle size.

These and other objectives of the present disclosure will no doubt become obvious to those of ordinary skill in the art after reading the following detailed description of the embodiment that is illustrated in the various figures and drawings.

DETAILED DESCRIPTION

Figure 1:
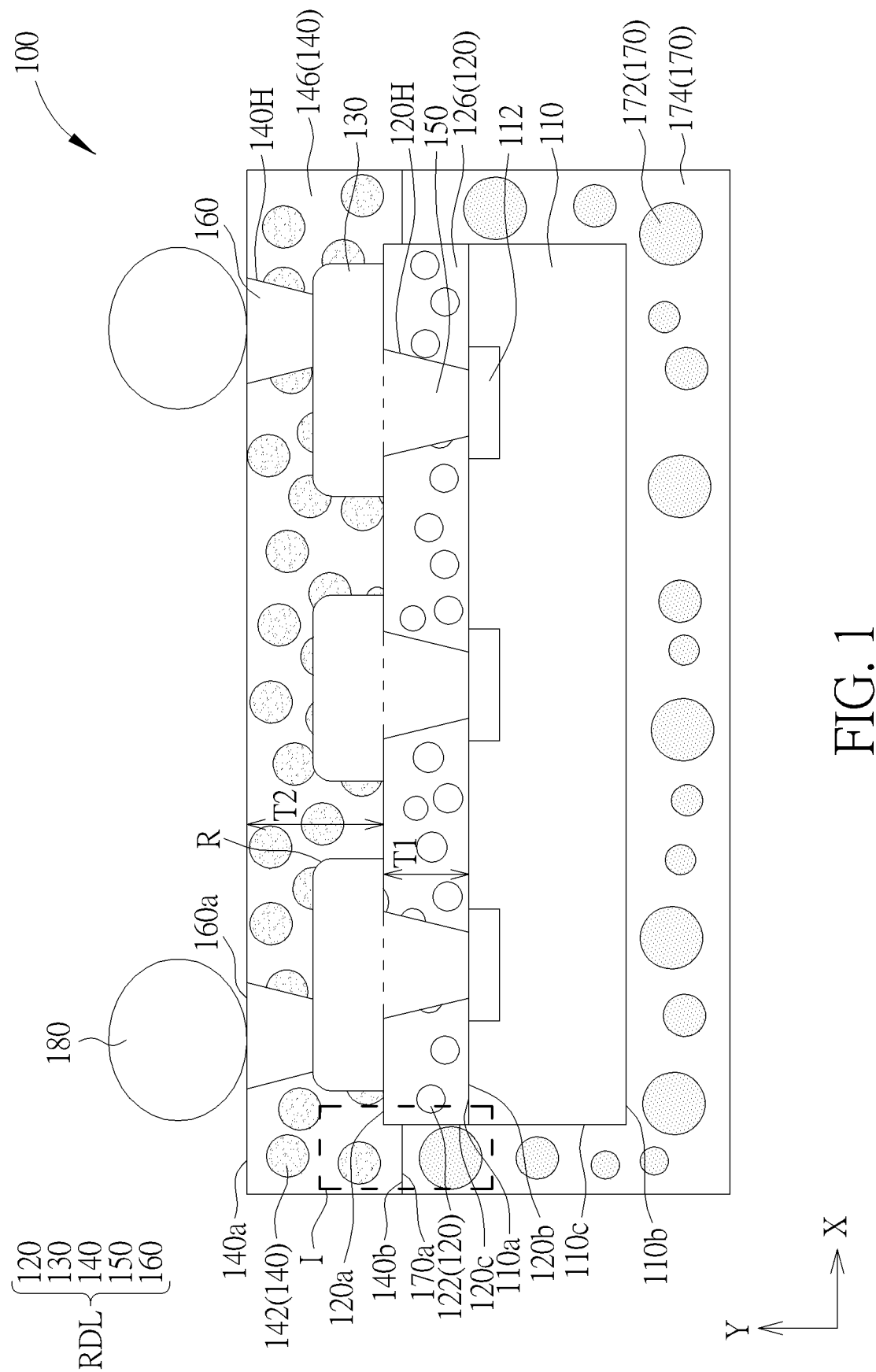
FIG. 1 is a partial cross-sectional schematic diagram of an electronic device according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The directional terms mentioned in this document, such as "up", "down", "front", "back", "left", "right", etc., are only directions referring to the drawings. Therefore, the directional terms used are for illustration, not for limitation of the present disclosure.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The electronic device of the present disclosure may be applied to a semiconductor package element, a display device, a light-emitting device, a backlight device, an antenna device, a sensing device or a tiled device, but not limited herein. The electronic device may include a bendable or flexible electronic device. The manufacturing process of the semiconductor package element may be a chip-first process or a RDL-first process, but not limited herein. The display device may include a non-self-emissive display device or a self-emissive display device. The antenna device may include a liquid-crystal type antenna device or an antenna device other than liquid-crystal type, and the sensing device may include a sensing device used for sensing capacitance, light, heat or ultrasonic waves, but not limited herein. The electronic device may include electronic elements such as passive elements and active elements, for example, capacitors, resistors, inductors, diodes, transistors, etc. The diode may include a light-emitting diode or a photodiode. For example, the light-emitting diode may include an organic light-emitting diode (OLED), a mini light-emitting diode (mini LED), a micro light-emitting diode (micro LED) or a quantum dot light-emitting diode (quantum dot LED), but not limited herein. The tiled device may be, for example, a display tiled device or an antenna tiled device, but not limited herein. It should be noted that the electronic device may be any arrangement and combination of the above, but not limited herein.

It should be noted that the technical features in different embodiments described in the following can be replaced, recombined, or mixed with one another to constitute another embodiment without departing from the spirit of the present disclosure.

Figure 2:
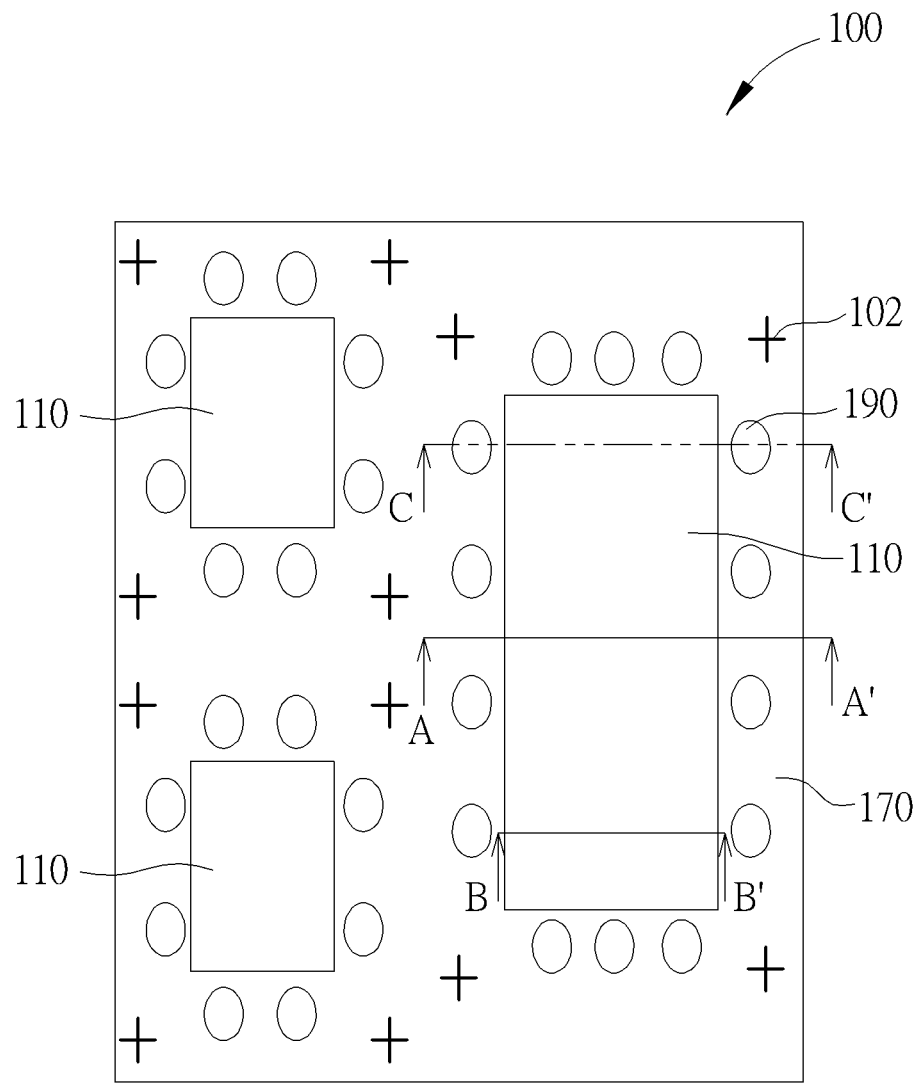
FIG. 2 is a bottom-view perspective schematic diagram of an electronic device according to an embodiment of the present disclosure.

Please refer to FIG. 1 and FIG. 2. FIG. 1 is a partial cross-sectional schematic diagram of an electronic device according to an embodiment of the present disclosure. FIG. 2 is a bottom-view perspective schematic diagram of an electronic device according to an embodiment of the present disclosure, that is, a perspective schematic diagram viewed from the bottom of the electronic device along a direction Y, wherein FIG. 1 is a partial cross-sectional schematic diagram along the section line A-A' of FIG. 2, for example. As shown in FIG. 1 and FIG. 2, an electronic device 100 according to an embodiment of the present disclosure may include an electronic unit 110 and a redistribution layer RDL. The electronic unit 110 has a plurality of connection pads 112, and the surface of the electronic unit 110 with the connection pads 112 disposed thereon may be, for example, referred as an active surface. The electronic unit 110 may include a die, a chip, a circuit, a diode, an integrated circuit (IC) or other suitable electronic units, but not limited herein. In some embodiments, the electronic unit 110 may further include a carrier, and the carrier may include a flexible carrier or a non-flexible carrier, such as glass, steel plate, polyimide (PI), polyethylene terephthalate (PET) or other suitable materials. In some embodiments, the electronic device 100 may include one or plural electronic units 110. FIG. 2 shows that the electronic device 100 includes a plurality of electronic units 110 as an example, but the present disclosure is not limited herein. For example, in some embodiments, the electronic device 100 may include one single electronic unit 110 (such as including the electronic unit 110 on the right side of FIG. 2, and not including the electronic units 110 on the left side of FIG. 2). In some embodiments, the electronic device 100 may further include a plurality of alignment marks 102, and the electronic units 110 may be aligned according to the alignment marks 102 when disposing the electronic units 110, so as to confirm the arrangement positions of the electronic units 110, but not limited herein.

As shown in FIG. 1, the redistribution layer RDL may be electrically connected to the electronic unit 110. Specifically, the redistribution layer RDL may include a first insulating layer 120, a first metal layer 130 and a second insulating layer 140. The first insulating layer 120 is disposed on the electronic unit 110, and the first insulating layer 120 has a plurality of first openings 120H. The plurality of first openings 120H of the first insulating layer 120 are disposed corresponding to the plurality of connection pads 112 of the electronic unit 110. Specifically, the first insulating layer 120 may directly contact the surface of the electronic unit 110, or a passivation layer may further be disposed between the surface of the first insulating layer 120 and the surface of the electronic unit 110. The passivation layer may include, for example, aluminium oxide ($Al_2O_3$), but not limited herein. The first openings 120H may be disposed corresponding to the connection pads 112 one on one. For example, each of the first openings 120H may respectively overlap one of the connection pads 112 in the direction Y. In the embodiments of the present disclosure, the direction Y may be the normal direction of the electronic device 100, that is, opposite to the top-view direction of the electronic device 100. Furthermore, a direction X may be perpendicular to the direction Y, and the direction X may be parallel to the horizontal direction of the cross-sectional view, but not limited herein.

The first metal layer 130 is disposed on the first insulating layer 120 and electrically connected to the electronic unit 110 through the plurality of connection pads 112. For example, the redistribution layer RDL may further include a second metal layer 150, and the second metal layer 150 is correspondingly filled in the plurality of first openings 120H. The second metal layer 150 may directly contact the connection pad 112 corresponding to each of the first openings 120H, so that the second metal layer 150 is respectively electrically connected to the corresponding plurality of connection pads 112, and the first metal layer 130 may directly contact and be electrically connected to the second metal layer 150 through the first openings 120H. That is to say, the first metal layer 130 may be electrically connected to the connection pads 112 of the electronic unit 110 through the second metal layer 150 disposed in the first openings 120H, but not limited herein. The first metal layer 130 and the second metal layer 150 may be manufactured in the same process, which may include the processes such as photolithography, electroplating, chemical plating, physical vapor deposition (PVD), chemical vapor deposition (CVD), surface treatment, grinding and/or etching. For example, a metal layer (not shown) is blanketly formed on the first insulating layer 120 first, and then a patterning process is performed to remove a portion of the metal layer. A portion of the patterned metal layer located on the first insulating layer 120 is regarded as the first metal layer 130, and a portion of the patterned metal layer located in the first openings 120H is regarded as the second metal layer 150. However, the manufacturing method and process for the first metal layer 130 and the second metal layer 150 of the present disclosure are not limited to the above.

Furthermore, the second insulating layer 140 is disposed on the first metal layer 130. The edge of the first metal layer 130 may, for example (but not limited to), have an arc angle R, so as to reduce the cracking of the second insulating layer 140 disposed on the first metal layer 130. Furthermore, the first insulating layer 120 includes a plurality of first filler particles 122, and the second insulating layer 140 includes a plurality of second filler particles 142. The plurality of first filler particles 122 may have a first maximum particle size D1, the plurality of second filler particles 142 may have a second maximum particle size D2, and the second maximum particle size D2 is greater than the first maximum particle size D1 (i.e., D2>D1).

Figure 3:
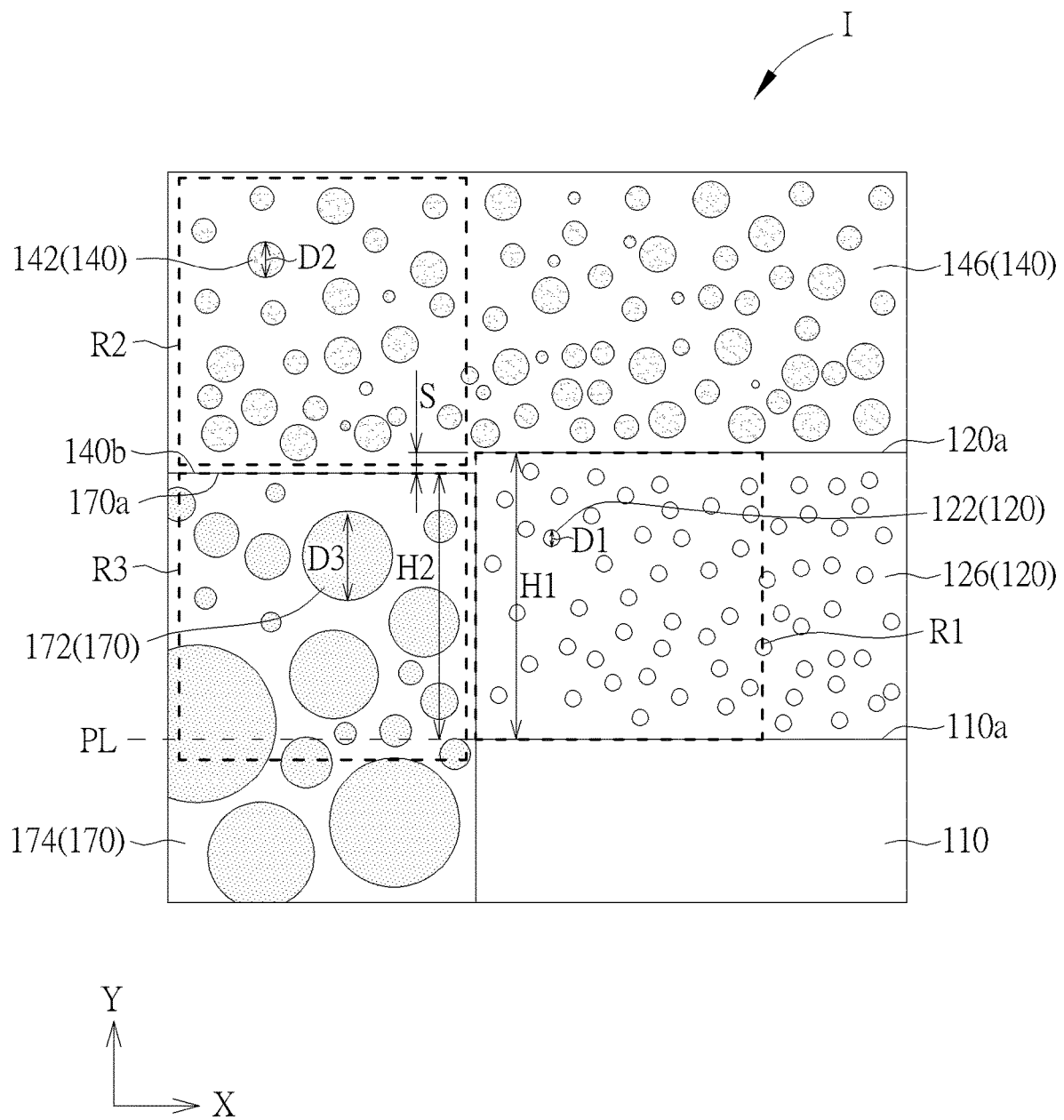
FIG. 3 is a depiction schematic diagram of a partial cross-sectional view of an electronic device according to an embodiment of the present disclosure.

The method for manufacturing the insulating layer may include processes such as coating, molding, attaching, heating and pressurizing, grinding, cutting and/or surface treatment. The method for measuring a maximum particle size such as the first maximum particle size D1 and the second maximum particle size D2 according to the present disclosure may be referred to FIG. 3, for example. FIG. 3 is a depiction schematic diagram of a partial cross-sectional view of an electronic device according to an embodiment of the present disclosure, wherein FIG. 3 may be, for example, a partially enlarged depiction schematic diagram of a region I in FIG. 1. As shown in FIG. 3, in a cross-sectional view of the electronic device (such as, but not limited to, using an image of a scanning electron microscope (SEM)), at the boundary of the first insulating layer 120 and the second insulating layer 140, based on a first distance H1 between an upper surface 120a of the first insulating layer 120 and an upper surface 110a of the electronic unit 110 in the direction Y, a range R1 whose length*width is H1*H1 may be framed in the first insulating layer 120, and a range R2 whose length*width is H1*H1 may be framed in the second insulating layer 140. Furthermore, the first filler particle 122 with the largest particle size is selected among the first filler particles 122 in the range R1, and the particle size of the selected first filler particle 122 is defined as the first maximum particle size D1. The second filler particle 142 with the largest particle size is selected among the second filler particles 142 in the range R2, and the particle size of the selected second filler particle 142 is defined as the second maximum particle size D2, but not limited herein.

The first insulating layer 120 may include the first filler particles 122 and an organic material 126, and the second insulating layer 140 may include the second filler particles 142 and an organic material 146. The first filler particles 122 and the second filler particles 142 may respectively include silicon dioxide ($SiO_2$), titanium dioxide ($TiO_2$), aluminium oxide ($Al_2O_3$) or other suitable filler particles. The organic material 126 and the organic material 146 respectively include, for example, epoxy, Ajinomoto build-up film (ABF) material, polyimide (PI), photosensitive polyimide (PSPI) or other suitable materials, but not limited herein.

The first maximum particle size D1 of the first filler particles 122 may range from 1 micrometer (um) to 5 micrometers (i.e., 1 um≤D1≤5 um), and the second maximum particle size D2 of the second filler particles 142 may range from 10 micrometers to 20 micrometers (i.e., 10 um≤D2≤20 um). The tensile strength of the first insulating layer 120 may range from 70 MPa to 100 MPa (i.e., 70 MPa≤tensile strength≤100 MPa), and the tensile strength of the second insulating layer 140 may be greater than 100 MPa (i.e., tensile strength>100 MPa), that is, the tensile strength of the second insulating layer 140 may be different from the tensile strength of the first insulating layer 120. For example, the tensile strength of the second insulating layer 140 may be greater than the tensile strength of the first insulating layer 120. A thickness T1 of the first insulating layer 120 in the direction Y (as shown in FIG. 1) may range from 10 micrometers to 100 micrometers (i.e., 10 um≤T1≤100 um), and a thickness T2 of the second insulating layer 140 in the direction Y (as shown in FIG. 1) may range from 10 micrometers to 200 micrometers (i.e., 10 um≤T2≤200 um). The dielectric constant (Dk) of the first insulating layer 120 may range from 2.5 to 3.5 (i.e., 2.5≤dielectric constant≤3.5), and the dielectric constant of the second insulating layer 140 may range from 3.2 to 4.0 (i.e., 3.2≤dielectric constant≤4.0). The dielectric constant of the second insulating layer 140 may be the same as or different from the dielectric constant of the first insulating layer 120.

According to the embodiments of the present disclosure, since the first insulating layer 120 close to the electronic unit 110 (or the first insulating layer 120 located in the lower layer) includes the first filler particles 122 with small particle sizes, it facilitates forming the first openings 120H with small sizes in the first insulating layer 120. Therefore, the circuit that is formed by filling the second metal layer 150 into the first openings 120H may have small line width and/or small line distance, which may improve the fan-out circuit of the electronic device 100 and/or provide more flexibility for the design of the fan-out circuit, thereby improving the design flexibility of the input/output (I/O) wire of the electronic device 100. In addition, since the second insulating layer 140 far away from the electronic unit 110 (or the second insulating layer 140 located in the upper layer) includes the second filler particles 142 with large particle sizes, the tensile strength of the second insulating layer 140 may be increased, thereby providing a better protection effect and improving the reliability of the electronic device 100.

For example, the method for measuring the tensile strength of the present disclosure may include performing a tensile test to a test specimen of the to-be-measured material by a universal testing machine, for example, but not limited to, performing the tensile test by the ASTM D638 standard, so as to obtain its material characteristics such as the proportional limit, yield point, ultimate stress, fracture stress, etc. The obtained value of the ultimate stress is the value of the tensile strength of the present disclosure. In some embodiments, the value of the tensile strength of a layer may be obtained according to the properties or characteristics of the material included in the layer, but not limited herein.

Figure 8:
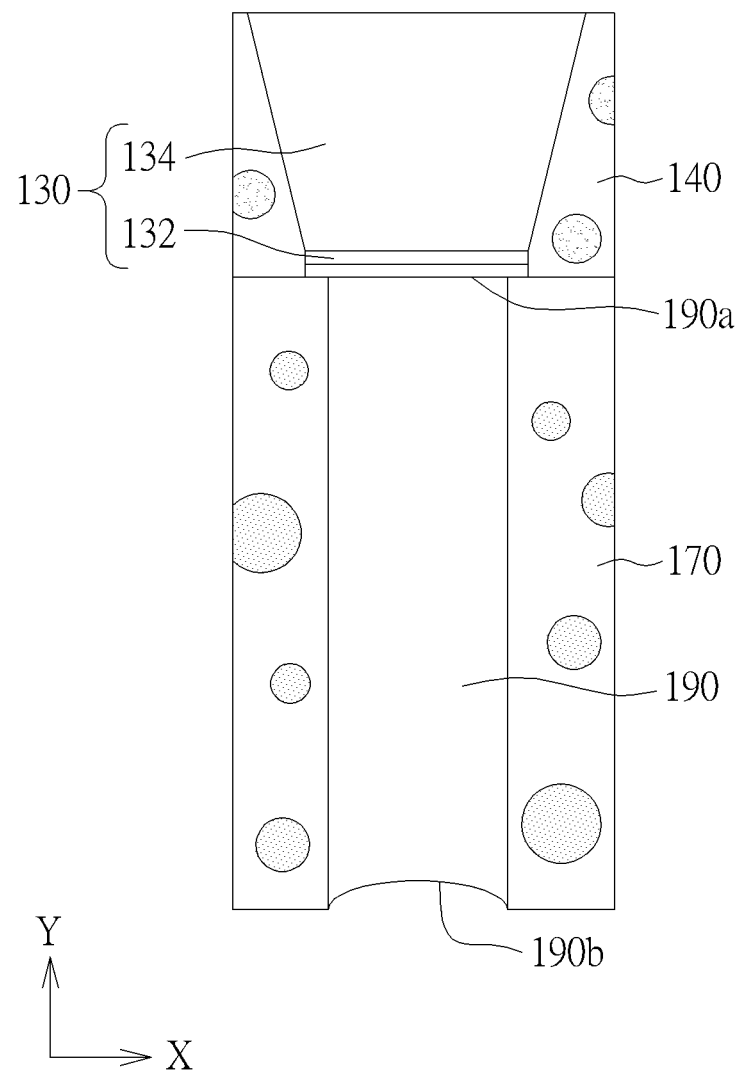
FIG. 8 is a partial cross-sectional schematic diagram of an electronic device according to an embodiment of the present disclosure.

As shown in FIG. 1, according to the electronic device 100 of the embodiment of the present disclosure, the second insulating layer 140 may further have a plurality of second openings 140H, and the plurality of second openings 140H may respectively overlap a portion of the first metal layer 130 in the direction Y. Furthermore, the redistribution layer RDL may further include a third metal layer 160. The third metal layer 160 is correspondingly filled in the plurality of second openings 140H, and the third metal layer 160 disposed in the second openings 140H may directly contact the first metal layer 130 to be electrically connected to the first metal layer 130. That is to say, the third metal layer 160 disposed in the second openings 140H may be electrically connected to the connection pads 112 of the electronic unit 110 through the first metal layer 130 and the second metal layer 150, but not limited herein. The plurality of insulating layers (e.g., the first insulating layer 120 and the second insulating layer 140) and the plurality of metal layers (e.g., the second metal layer 150, the first metal layer 130 and the third metal layer 160) stacked in the direction Y may form the redistribution layer RDL, so as to redistribute the circuit, but the number of insulating layers, the number of metal layers and the circuit layout in the redistribution layer RDL are not limited to the drawings provided by the present disclosure. For example, the first insulating layer 120 may be the lowest insulating layer closest to the electronic unit 110, and the second insulating layer 140 may be the uppermost insulating layer farthest from the electronic unit 110. Furthermore, in some embodiments, at least one insulating layer and/or at least one metal layer may be disposed between the first insulating layer 120 and the second insulating layer 140, but not limited herein. The second metal layer 150, the first metal layer 130 and/or the third metal layer 160 may include a seed layer and an electroplating metal layer, but not limited to. According to some embodiments, the third metal layer 160 may include an electroplating metal layer. According to some embodiments, a surface roughness of a side surface of the third metal layer 160 is different from a surface roughness of a top surface of the third metal layer 160, but not limited to. For example, as shown in FIG. 8, the first metal layer 130 includes a seed layer 132 and an electroplating metal layer 134, but not limited herein. The seed layer and the electroplating metal layer may include single-layer material or multi-layer materials, such as titanium, copper, molybdenum, aluminum, nickel, silver, tin, other suitable conductive materials or combinations of the above, but not limited herein. The seed layer may contribute to the formation of the electroplating metal layer or improve adhesion, but not limited herein.

In some embodiments, as shown in FIG. 1, the electronic device 100 may further include a protective layer 170, and the protective layer 170 may surround the electronic unit 110 to isolate moisture and air and/or reduce damage to the electronic unit 110. The "surround" herein may mean that in a cross-sectional schematic diagram, the protective layer 170 contacts at least one surface of the electronic unit 110. For example, the electronic unit 110 may include the upper surface 110a, a lower surface 110b opposite to the upper surface 110a, and a side surface 110c connected to the upper surface 110a and the lower surface 110b. The protective layer 170 may cover the side surface 110c of the electronic unit 110 but not cover the lower surface 110b in some embodiments, that is, the lower surface 110b of the electronic unit 110 is exposed, or the protective layer 170 may cover both of the side surface 110c and the lower surface 110b of the electronic unit 110 in some embodiments (as shown in FIG. 1). The protective layer 170 may include an encapsulant material 174. The encapsulant material 174 includes, for example, epoxy, epoxy molding compound (EMC), poly(methyl methacrylate) (PMMA), polydimethylsiloxane (PDMS), ceramic, other suitable encapsulant materials or combinations of the above materials, but not limited herein. In some embodiments, the hardness of the protective layer 170 may be different from the hardness of the first insulating layer 120 and the hardness of the second insulating layer 140.

The first insulating layer 120 may include the upper surface 120a, a lower surface 120b opposite to the upper surface 120a, and a side surface 120c connected to the upper surface 120a and the lower surface 120b. The second insulating layer 140 may include an upper surface 140a and a lower surface 140b opposite to the upper surface 140a. The protective layer 170 may contact a portion of the side surface 120c of the first insulating layer 120 and a portion of the lower surface 140b of the second insulating layer 140. In some embodiments, the side surface 120c of the first insulating layer 120 may be aligned with the side surface 110c of the electronic unit 110, but not limited herein.

In one embodiment, as shown in FIG. 1 and FIG. 3, the upper surface 170a of the protective layer 170 contacts a portion of the lower surface 140b of the second insulating layer 140, and a step difference S exists between the upper surface 120a of the first insulating layer 120 and the upper surface 170a of the protective layer 170. Specifically, in the normal direction Y of the electronic device 100, the first distance H1 exists between the upper surface 120a of the first insulating layer 120 and the upper surface 110a of the electronic unit 110 (such as being substantially equal to the thickness T1 of the first insulating layer 120), and a second distance H2 exists between the upper surface 170a of the protective layer 170 and a plane PL where the upper surface 110a of the electronic unit 110 is located. The first distance H1 may be greater than the second distance H2, which may, for example, achieve the effect of anchoring and/or fixing, thereby improving the adhesion between the layers.

In some embodiments, the protective layer 170 may include a plurality of third filler particles 172, and the plurality of third filler particles 172 have a third maximum particle size D3. The third maximum particle size D3 may be greater than the second maximum particle size D2, and the second maximum particle size D2 may be greater than the first maximum particle size D1 (i.e., D3>D2>D1). In some embodiments, the third maximum particle size D3 may be greater than or equal to 6 times the first maximum particle size D1 and less than or equal to 9 times the first maximum particle size D1 (i.e., D1*6≤D3≤D1*9), but not limited herein. In some embodiments, the third maximum particle size D3 may be greater than or equal to 3 times the second maximum particle size D2 and less than or equal to 6 times the second maximum particle size D2 (i.e., D2*3≤D3≤D2*6), but not limited herein. Through the design of different particle sizes, the protection effect may be improved, and the fan-out capability of the circuit may be achieved.

The method for measuring the third maximum particle size D3 according to the present disclosure may be referred to FIG. 3 and the previous method for measuring the first maximum particle size D1 and the second maximum particle size D2. As shown in FIG. 3, in a cross-sectional view of the electronic device 100, at the boundary of the first insulating layer 120, the second insulating layer 140 and the protective layer 170, based on the first distance H1, a range R3 whose length*width is H1*H1 may be framed in the protective layer 170. Furthermore, the third filler particle 172 with the largest particle size is selected among the third filler particles 172 in the range R3, and the particle size of the selected third filler particle 172 is defined as the third maximum particle size D3, but not limited herein.

Figure 4:
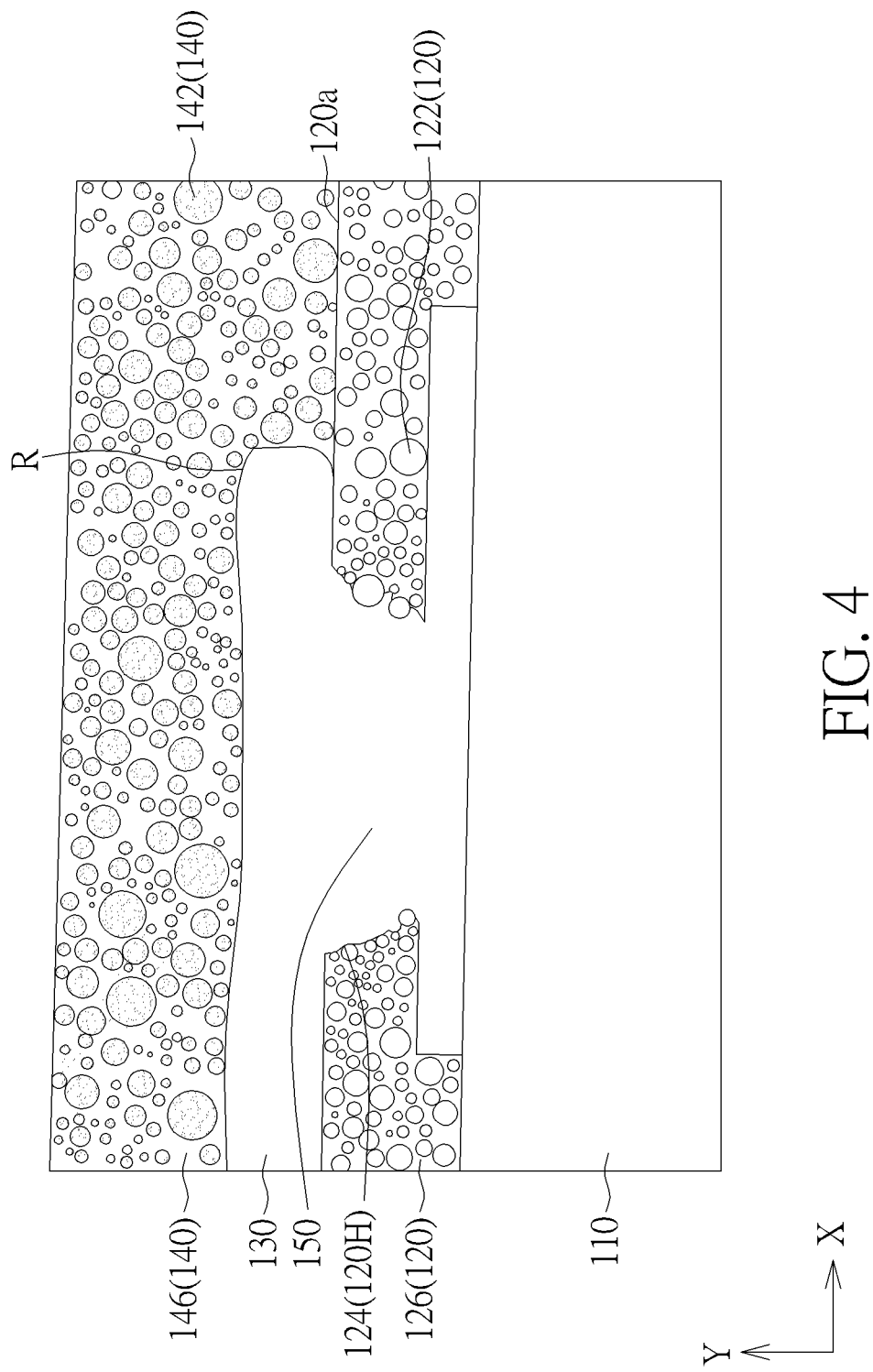
FIG. 4 is a depiction schematic diagram of a partial cross-sectional view of an electronic device according to an embodiment of the present disclosure.

Please refer to FIG. 4 and FIG. 1. FIG. 4 is a depiction schematic diagram of a partial cross-sectional view of an electronic device according to an embodiment of the present disclosure, wherein FIG. 4 shows, for example, the detailed structure of the first opening 120H of FIG. 1. As shown in FIG. 4, since the first insulating layer 120 includes the first filler particles 122, a roughness of a surface of a side wall 124 of one first opening 120H of the plurality of first openings 120H that are formed in the first insulating layer 120 by a patterning process may be greater than a roughness of the upper surface 120a of the first insulating layer 120. That is to say, the side wall 124 of the first opening 120H may be, for example, an uneven rough surface along the surface profiles of the first filler particles 122, so that the adhesion between the second metal layer 150 disposed in the first opening 120H and the first insulating layer 120 may be improved. In some embodiments, since the second insulating layer 140 includes the second filler particles 142, a roughness of a surface of a side wall of one second opening 140H of the plurality of second openings 140H (not shown in FIG. 4) that are formed in the second insulating layer 140 by a patterning process may be greater than a roughness of the upper surface 140a of the second insulating layer 140. That is to say, the side wall of the second opening 140H may be, for example, an uneven rough surface along the surface profiles of the second filler particles 142, so that the adhesion between the third metal layer 160 disposed in the second opening 140H and the second insulating layer 140 may be improved, but not limited herein. The measurement of the roughness may be, for example, analyzed or measured by using a surface roughness tester or a scanning electron microscope, but not limited herein.

Figure 5:
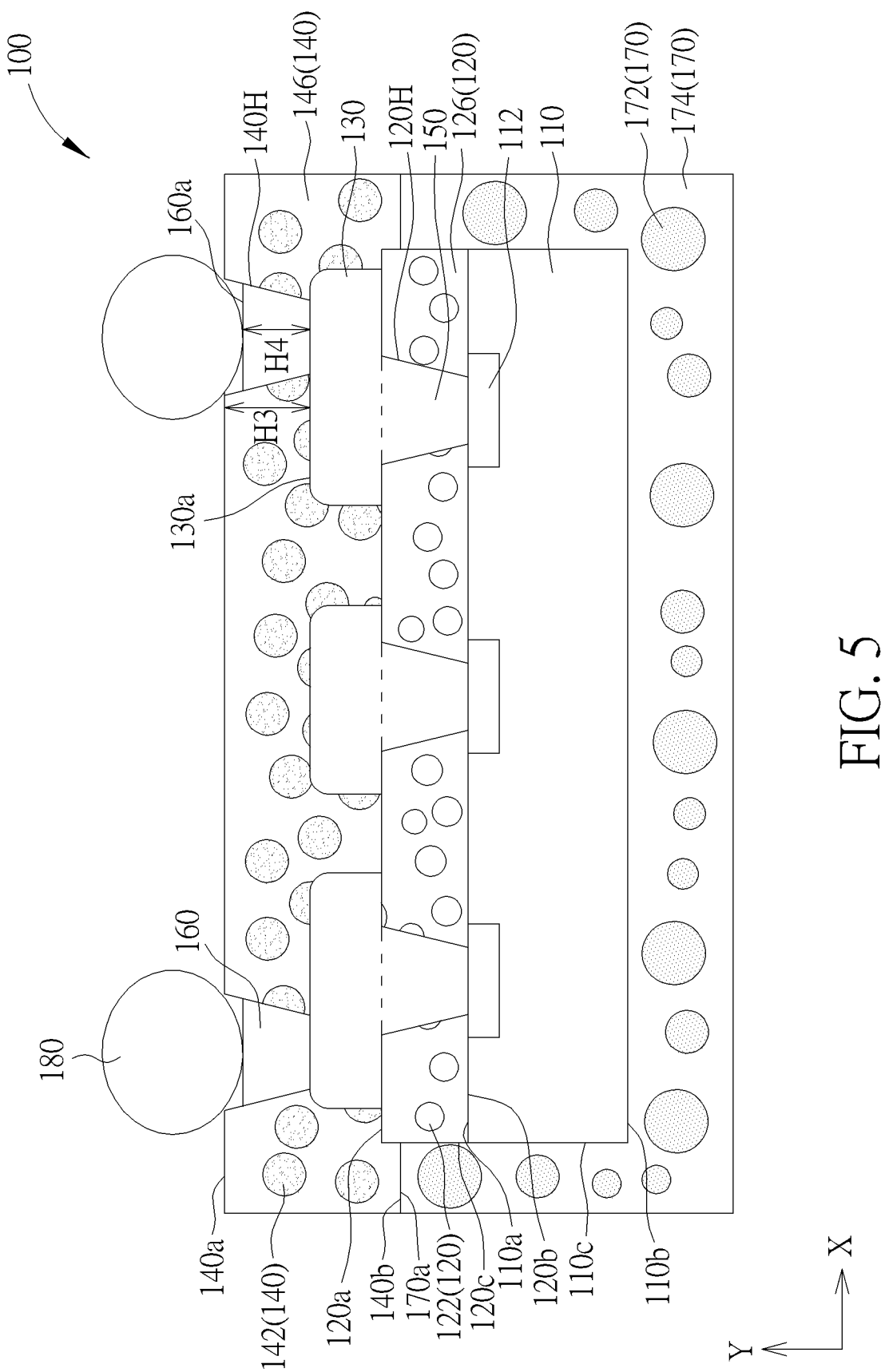
FIG. 5 is a partial cross-sectional schematic diagram of an electronic device according to another embodiment of the present disclosure.

As shown in FIG. 1, according to the electronic device 100 of the embodiment of the present disclosure, the second insulating layer 140 may expose the third metal layer 160 located at the uppermost layer in the redistribution layer RDL. Furthermore, the electronic device 100 may further include a plurality of bonding elements 180, and the plurality of bonding elements 180 are disposed on the exposed third metal layer 160 and respectively electrically connected to the third metal layer 160, so that the third metal layer 160 may serve as upper metal bonding pads connected to the bonding elements 180. The bonding element 180 may be, for example, a bump, a solder ball, a pad or other suitable bonding elements. The bonding element 180 may include, for example, copper, aluminum, gold, silver, nickel, tin, lead, other suitable conductive materials or combinations of the above materials, but not limited herein. In some embodiments, as shown in FIG. 1, the upper surface 140a of the second insulating layer 140 may be aligned with an upper surface 160a of the third metal layer 160, but not limited herein. In some embodiments, as shown in FIG. 5, which is a partial cross-sectional schematic diagram of an electronic device according to another embodiment of the present disclosure, a step difference may exist between the upper surface 140a of the second insulating layer 140 and the upper surface 160a of the third metal layer 160. Specifically, in the normal direction Y of the electronic device 100, a third distance H3 exists between the upper surface 140a of the second insulating layer 140 and an upper surface 130a of the first metal layer 130, and a fourth distance H4 exists between the upper surface 160a of the third metal layer 160 and the upper surface 130a of the first metal layer 130. The third distance H3 may be greater than the fourth distance H4, which may facilitate the positioning and stability of the bonding elements 180, but not limited herein. The third distance H3 may be less than the fourth distance H4 in other embodiments.

Figure 6:
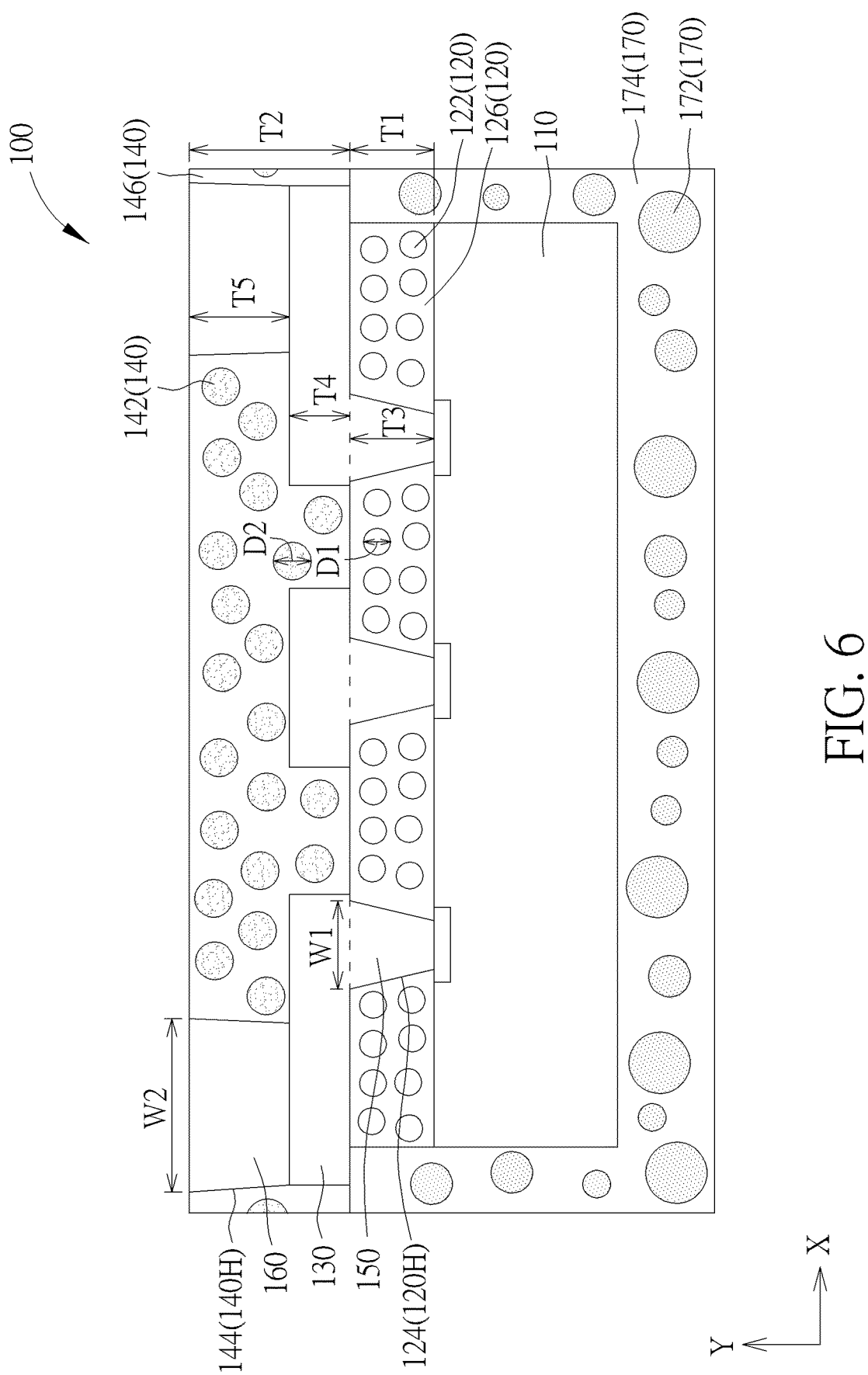
FIG. 6 is another partial cross-sectional schematic diagram of an electronic device according to an embodiment of the present disclosure.

Please refer to FIG. 6 and FIG. 2. FIG. 6 is another partial cross-sectional schematic diagram of an electronic device according to an embodiment of the present disclosure, wherein FIG. 6 is a partial cross-sectional schematic diagram along the section line B-B' of FIG. 2, for example. In some embodiments, as shown in FIG. 6, one first opening 120H of the plurality of first openings 120H may have a first upper width W1, one second opening 140H of the plurality of second openings 120H may have a second upper width W2, and the first upper width W1 may be less than the second upper width W2. Since the first opening 120H has a smaller first upper width W1, the second metal layer 150 filled in the first opening 120H may have a smaller upper width, which may reduce the influence on the input/output design or layout. Furthermore, since the second opening 140H has a larger second upper width W2, the third metal layer 160 filled in the second opening 140H may have a larger upper width, which may increase the fan-out area of the circuit and facilitate the connection with the bonding elements (e.g., the bonding elements 180 shown in FIG. 1). The signal transmission of the electronic device 100 may be improved through the above design. For example, in a cross-sectional view, the side wall 124 of the first opening 120H and a side wall 144 of the second opening 140H may be inclined walls respectively, that is, the width of the first opening 120H and the width of the second opening 140H may gradually decrease from the top to the bottom respectively. The maximum width of the first opening 120H measured in the direction X may be the first upper width W1, and the maximum width of the second opening 140H measured in the direction X may be the second upper width W2, but not limited herein.

As shown in FIG. 6, in some embodiments, the first maximum particle size D1 of the first filler particles 122 of the first insulating layer 120 may be less than a thickness T3 of the second metal layer 150 in the direction Y, and the thickness T3 of the second metal layer 150 is, for example, substantially equal to the thickness T1 of the first insulating layer 120. In some embodiments, the second maximum particle size D2 of the second filler particles 142 of the second insulating layer 140 may be less than a thickness T4 of the first metal layer 130 in the direction Y, and the thickness T4 of the first metal layer 130 is, for example, one-third of the thickness T2 of the second insulating layer 140, but not limited herein. In some embodiments, the second maximum particle size D2 of the second filler particles 142 of the second insulating layer 140 may be less than a thickness T5 of the third metal layer 160 in the direction Y, and the thickness T5 of the third metal layer 160 is, for example, two-thirds of the thickness T2 of the second insulating layer 140, but not limited herein.

Figure 7:
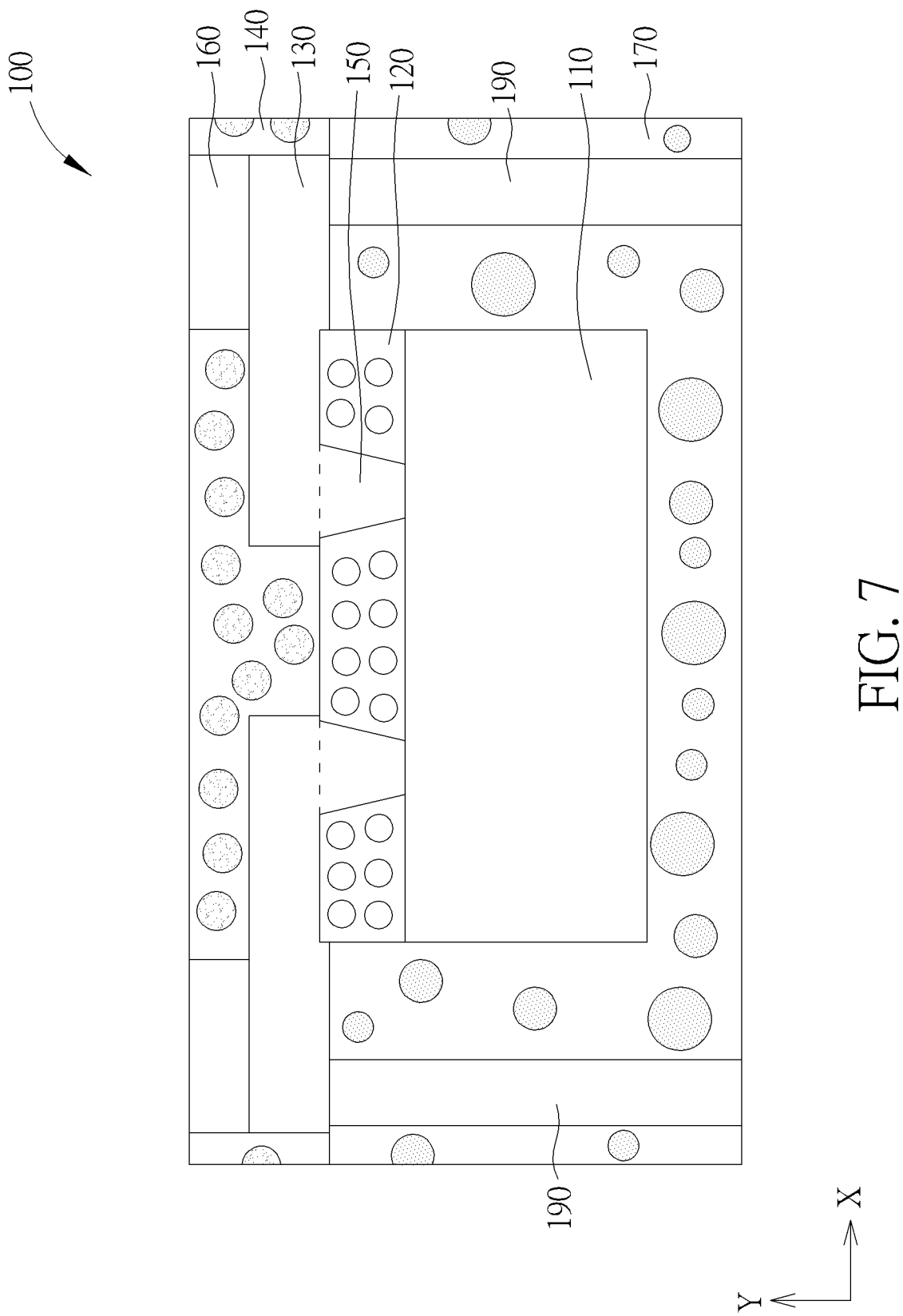
FIG. 7 is still another partial cross-sectional schematic diagram of an electronic device according to an embodiment of the present disclosure.

Please refer to FIG. 7 and FIG. 2. FIG. 7 is still another partial cross-sectional schematic diagram of an electronic device according to an embodiment of the present disclosure, wherein FIG. 7 is a partial cross-sectional schematic diagram along the section line C-C' of FIG. 2, for example. As shown in FIG. 7, the electronic device 100 of the present disclosure may further include a plurality of through hole structures 190. The first metal layer 130 is disposed on the protective layer 170, and the plurality of through hole structures 190 may be disposed on a side (such as the lower side) of the first metal layer 130 and extend and pass through the protective layer 170 along a direction opposite to the direction Y. Each of the through hole structures 190 may be electrically connected to or electrically isolated from the first metal layer 130 respectively, and the plurality of through hole structures 190 may further achieve the function of heat dissipation, but not limited herein. In some embodiments, the warpage may be reduced through the arrangement of the through hole structures 190, but not limited herein. The through hole structure 190 may be a single-layer structure or a stack of multiple material layers, such as including copper, tin, nickel, gold, titanium, other suitable conductive materials, other suitable heat dissipation materials or combinations of the above materials, but not limited herein. In some embodiments, the electronic unit 110 may be located between two adjacent through hole structures 190 of the plurality of through hole structures 190, and these through hole structures 190 may limit the position of the electronic unit 110, so as to reduce the shift of the position of the electronic unit 110.

Please refer to FIG. 8 and FIG. 7. FIG. 8 is a partial cross-sectional schematic diagram of an electronic device according to an embodiment of the present disclosure, wherein FIG. 8 shows a variation embodiment of the first metal layer 130 and the through hole structure 190 of FIG. 7, for example. In some embodiments, as shown in FIG. 8, the first metal layer 130 may include the seed layer 132 and the electroplating metal layer 134. The seed layer 132 may be disposed on the protective layer 170, and the electroplating metal layer 134 may be disposed on the seed layer 132. The seed layer 132 may include multi-layer materials as shown in FIG. 8 or single-layer material. The materials of the seed layer 132 and the electroplating metal layer 134 may be referred to the description of the previous embodiment, which will not be described redundantly herein. Furthermore, at least one of the plurality of through hole structures 190 may be subjected to a surface treatment such as grinding, acid etching and other suitable processes. Specifically, one of the plurality of through hole structures 190 may include an upper surface 190a and a lower surface 190b opposite to the upper surface 190a, and the upper surface 190a of the through hole structure 190 may contact the first metal layer 130. The lower surface 190b of the through hole structure 190 may be concave or rough, which may facilitate the connection with bonding elements (not shown). The through hole structure 190 may further be electrically connected to other electronic elements through the connected bonding elements, but not limited herein. In addition, that the lower surface 190b of the through hole structure 190 is rough may further improve the effect of heat dissipation. According to some embodiments, the electronic device 100 of the present disclosure may be applied in a quad flat no-leads (QFN) package or replace the electronic device having a lead frame, but not limited herein.

From the above description, according to the electronic devices of the embodiments of the present disclosure, by making the maximum particle size of the filler particles of the second insulating layer greater than the maximum particle size of the filler particles of the first insulating layer, the fan-out circuit of the electronic device may be improved, thereby improving the design flexibility of the input/output wire of the electronic device and improving the reliability of the electronic device. In addition, through the design that the first distance is greater than the second distance, the adhesion between the layers may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
an electronic unit having a plurality of connection pads; and
a redistribution layer electrically connected to the electronic unit, the redistribution layer comprising:
a first insulating layer disposed on the electronic unit, wherein the first insulating layer has a plurality of first openings, and the plurality of first openings are disposed corresponding to the plurality of connection pads;
a first metal layer disposed on the first insulating layer and electrically connected to the electronic unit through the plurality of connection pads; and
a second insulating layer disposed on the first metal layer,
wherein the first insulating layer comprises a plurality of first filler particles, and the second insulating layer comprises a plurality of second filler particles, wherein the plurality of first filler particles have a first maximum particle size, the plurality of second filler particles have a second maximum particle size, and the second maximum particle size is greater than the first maximum particle size.

2. The electronic device according to claim 1, further comprising a protective layer surrounding the electronic unit, wherein the protective layer contacts a portion of a side surface of the first insulating layer and a portion of a lower surface of the second insulating layer.

3. The electronic device according to claim 2, wherein in a normal direction of the electronic device, a first distance exists between an upper surface of the first insulating layer and an upper surface of the electronic unit, and a second distance exists between an upper surface of the protective layer and a plane where the upper surface of the electronic unit is located, wherein the first distance is greater than the second distance.

4. The electronic device according to claim 2, wherein the protective layer comprises a plurality of third filler particles, and the plurality of third filler particles have a third maximum particle size, wherein the third maximum particle size is greater than the second maximum particle size.

5. The electronic device according to claim 4, wherein the third maximum particle size is greater than or equal to 6 times the first maximum particle size and less than or equal to 9 times the first maximum particle size.

6. The electronic device according to claim 4, wherein the third maximum particle size is greater than or equal to 3 times the second maximum particle size and less than or equal to 6 times the second maximum particle size.

7. The electronic device according to claim 2, further comprising a plurality of through hole structures disposed on a side of the first metal layer and extending and passing through the protective layer.

8. The electronic device according to claim 7, wherein the electronic unit is located between two adjacent ones of the plurality of through hole structures.

9. The electronic device according to claim 7, wherein a lower surface of one of the plurality of through hole structures is concave.

10. The electronic device according to claim 1, wherein the second maximum particle size is less than a thickness of the first metal layer in a normal direction of the electronic device.

11. The electronic device according to claim 1, wherein a roughness of a surface of a side wall of one of the plurality of first openings is greater than a roughness of an upper surface of the first insulating layer.

12. The electronic device according to claim 1, wherein the redistribution layer further comprises a second metal layer correspondingly filled in the plurality of first openings, wherein the second metal layer is electrically connected to the plurality of connection pads, and the first metal layer is electrically connected to the second metal layer.

13. The electronic device according to claim 12, wherein the first maximum particle size is less than a thickness of the second metal layer in a normal direction of the electronic device.

14. The electronic device according to claim 1, wherein the second insulating layer has a plurality of second openings, and the plurality of second openings respectively overlap a portion of the first metal layer in a normal direction of the electronic device.

15. The electronic device according to claim 14, wherein the redistribution layer further comprises a third metal layer correspondingly filled in the plurality of second openings, wherein the third metal layer is electrically connected to the first metal layer.

16. The electronic device according to claim 15, wherein the second maximum particle size is less than a thickness of the third metal layer in the normal direction of the electronic device.

17. The electronic device according to claim 15, further comprising a plurality of bonding elements disposed on the third metal layer and respectively electrically connected to the third metal layer.

18. The electronic device according to claim 15, wherein in the normal direction of the electronic device, a third distance exists between an upper surface of the second insulating layer and an upper surface of the first metal layer, and a fourth distance exists between an upper surface of the third metal layer and the upper surface of the first metal layer, wherein the third distance is greater than the fourth distance.

19. The electronic device according to claim 14, wherein one of the plurality of first openings has a first upper width, one of the plurality of second openings has a second upper width, and the first upper width is less than the second upper width.

20. The electronic device according to claim 14, wherein a roughness of a surface of a side wall of one of the plurality of second openings is greater than a roughness of an upper surface of the second insulating layer.

* * * * *